United States Patent
Tseng et al.

(10) Patent No.: US 10,510,597 B2
(45) Date of Patent: Dec. 17, 2019

(54) METHODS FOR HYBRID WAFER BONDING INTEGRATED WITH CMOS PROCESSING

(71) Applicant: Taiwan Semiconductor Manufacturing Company, Ltd., Hsinchu (TW)

(72) Inventors: Pin-Nan Tseng, Hsinchu (TW); Chia-Shiung Tsai, Hsinchu (TW); Ping-Yin Liu, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/670,786

(22) Filed: Aug. 7, 2017

(65) Prior Publication Data

US 2017/0338150 A1    Nov. 23, 2017

Related U.S. Application Data

(62) Division of application No. 13/903,700, filed on May 28, 2013, now Pat. No. 9,728,453.

(60) Provisional application No. 61/793,766, filed on Mar. 15, 2013, provisional application No. 61/798,664, filed on Mar. 15, 2013.

(51) Int. Cl.
  *H01L 21/768* (2006.01)
  *H01L 23/00* (2006.01)

(52) U.S. Cl.
  CPC .. *H01L 21/76895* (2013.01); *H01L 21/76838* (2013.01); *H01L 24/03* (2013.01);
  (Continued)

(58) Field of Classification Search
  CPC ......... H01L 21/76801; H01L 21/76814; H01L 21/76819; H01L 21/76828;
  (Continued)

(56) References Cited

U.S. PATENT DOCUMENTS 6,309,970 B1 * 10/2001 Ito .................... H01L 21/76888
  257/E21.3
7,385,283 B2   6/2008 Wu et al.
  (Continued)

OTHER PUBLICATIONS

Fan et al., "Low Temperature Wafer-Level Metal Thermo-Compression Bonding Technology for 3D Integration," @2012 Fan and Tan, licensee InTech, pp. 71-94.

*Primary Examiner* — Syed I Gheyas
(74) *Attorney, Agent, or Firm* — Slater Matsil, LLP

(57) ABSTRACT

Methods for forming an integrated device using CMOS processing with wafer bonding. In an embodiment, a method is disclosed that includes defining an integrated circuit function using a front-end substrate having one or more active devices and a back-end substrate having connections formed in metal layers in dielectric material, wherein the back-end substrate is free from active devices; manufacturing the front-end substrate in a first semiconductor process; more or less simultaneously, manufacturing the back-end substrate in a second semiconductor process; physically contacting bonding surfaces of the front-end substrate and the back-end substrate; and performing wafer bonding to form bonds between the front-end and back-end substrates to form an integrated circuit. Additional methods are disclosed.

20 Claims, 9 Drawing Sheets

(52) U.S. Cl.
CPC ............ *H01L 2224/03003* (2013.01); *H01L 2224/03438* (2013.01); *H01L 2924/13091* (2013.01)

(58) Field of Classification Search
CPC ........... H01L 21/76838; H01L 21/7684; H01L 21/76895; H01L 24/03; H01L 24/04; H01L 24/05
See application file for complete search history.

(56) References Cited

U.S. PATENT DOCUMENTS

| | | | |
|---|---|---|---|
| 7,465,408 B1 | 12/2008 | Avanzino | |
| 8,211,844 B2 * | 7/2012 | Sharma | C11D 7/08 134/1.3 |
| 8,802,538 B1 | 8/2014 | Liu et al. | |
| 2008/0233710 A1 | 9/2008 | Hsu et al. | |
| 2008/0277778 A1 * | 11/2008 | Furman | H01L 21/2007 257/713 |
| 2010/0013102 A1 | 1/2010 | Tay et al. | |
| 2010/0029058 A1 | 2/2010 | Shimomura et al. | |
| 2010/0295136 A1 | 11/2010 | Or-Bach et al. | |
| 2012/0039004 A1 | 2/2012 | Artieri | |
| 2012/0100657 A1 | 4/2012 | Di Cioccio et al. | |
| 2012/0193752 A1 | 8/2012 | Purushothaman et al. | |
| 2012/0273940 A1 | 11/2012 | Jo | |
| 2013/0049215 A1 * | 2/2013 | Larsen | H01L 23/485 257/774 |
| 2013/0146561 A1 * | 6/2013 | Chen | H01L 21/823487 216/13 |
| 2013/0273691 A1 | 10/2013 | Pascual et al. | |

\* cited by examiner

METHODS FOR HYBRID WAFER BONDING INTEGRATED WITH CMOS PROCESSING

PRIORITY CLAIM AND CROSS-REFERENCE

This application is a division of U.S. patent application Ser. No. 13/903,700, entitled, "Methods for Hybrid Wafer Bonding Integrated with CMOS Processing," filed on May 28, 2013, which application is related to U.S. Provisional Patent No. 61/793,766, filed Mar. 15, 2013, entitled "Methods for Hybrid Wafer Bonding," and to U.S. Provisional Patent No. 61/798,664, filed Mar. 15, 2013, entitled "Methods for Hybrid Wafer Bonding Integrated with CMOS Processing," which applications are hereby incorporated herein by reference in their entirety.

TECHNICAL FIELD

The embodiments relate generally to the use of bonding between substrates, which include but are not limited to semiconductor wafers. The use of the bonding methods is applicable to a variety of devices where two substrates are bonded.

BACKGROUND

Recent improvements for substrate to substrate or wafer bonding are increasingly important in 3D IC structures. Wafer bonding is increasingly used to provide increased integration by forming vertical stacks of semiconductor devices without the need for intervening structures such as substrates or circuit boards. By bonding wafers directly, a single packaged integrated circuit may be produced which includes two or more wafer layers, providing increased system on a chip capabilities. In one particular application of wafer bonding, an array of image sensors is formed on one wafer and bonded to an image sensor circuit wafer, to provide an integrated image sensor system in a single packaged device.

Wafer to wafer bonding approaches known previously include oxide-oxide or fusion bonding, and metal to metal bonding using thermocompression bonding at higher pressure and high temperatures. These prior approaches induce high mechanical and thermal stress on the devices, or fail to provide needed metal-to-metal connections.

BRIEF DESCRIPTION OF THE DRAWINGS

For a more complete understanding of the illustrative embodiments described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
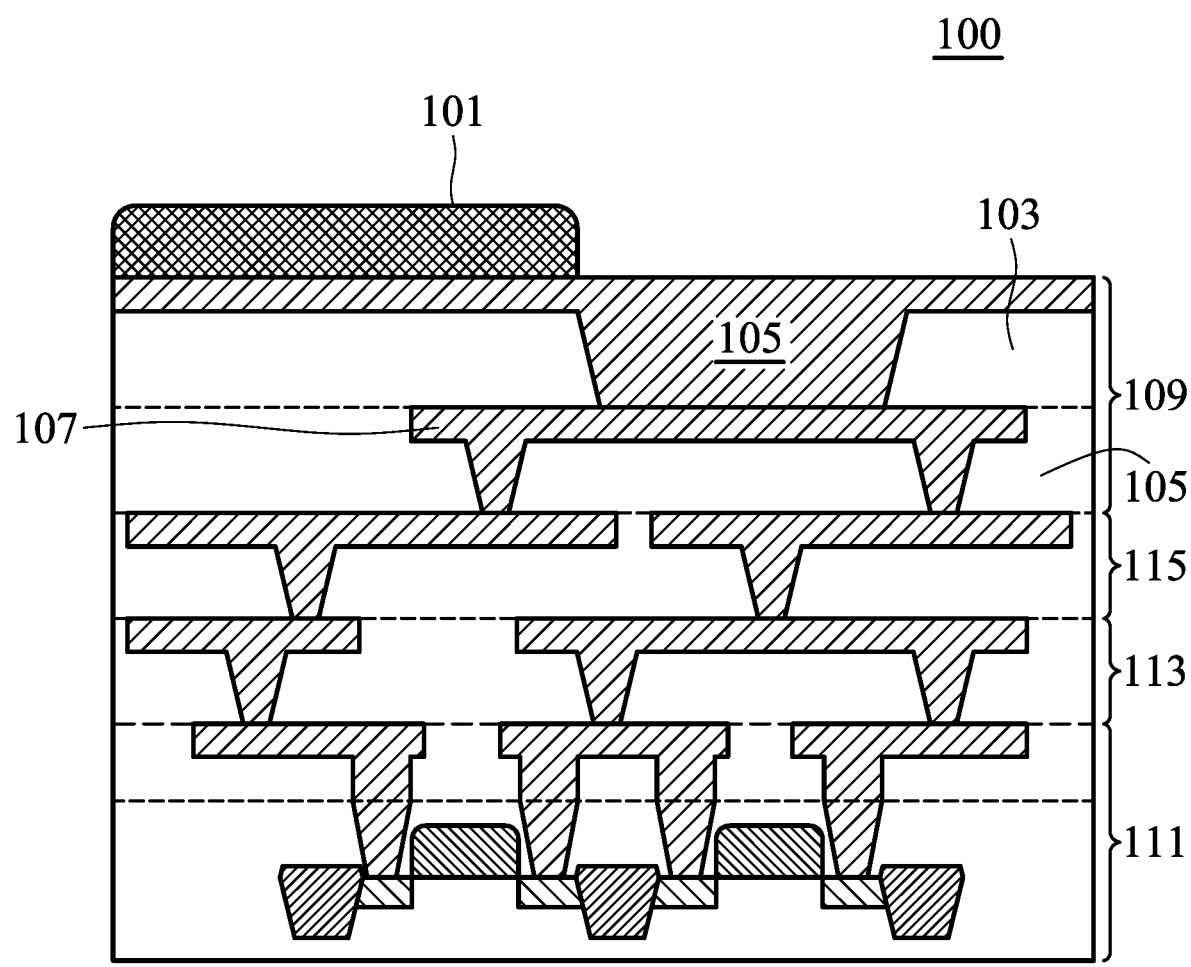
FIG. 1 illustrates in a cross-sectional view a portion of a substrate including an advanced integrated circuit structure, used to illustrate the embodiments.

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

The use of wafer bonding to provide higher integration in semiconductor devices by producing 3D devices is increasing. As described in the related application entitled "Methods for Hybrid Wafer Bonding," the embodiments of the related application which is incorporated herein by reference above provide methods for metal pad to metal pad bonding with robust connections at the interface between two substrates.

In advanced semiconductor process nodes, cycle time for CMOS integrated circuits produced using multiple layers of metallization are increasing. Recently, cycle times for an advanced semiconductor process using multiple levels of metal may be from 4-8 weeks. As the minimum feature sizes of the semiconductor processes continue to shrink, the complexities of manufacturing these devices is increasing, which results in further increases in cycle time. Problems with defects also become more acute as the devices being manufactured become ever smaller. For example, plasma treatments of layers being formed above a semiconductor substrate may lead to plasma induced defects (PID) problems in the layers previously formed, reducing yield.

Semiconductor manufacturing processes for forming active devices such as metal-oxide-semiconductor FET devices are classified as "front-end-of the-line" (FEOL) or "front-end" and "back-end-of-the-line" (BEOL) or "back-end" processes. Front-end processes include doping regions by ion implantation including well implants to form n and p regions in a substrate, shallow trench isolation or LOCOS isolation to device active areas for devices, forming gate structures including deposition of gate dielectrics and forming gate conductors, forming source and drain regions including ion implantation and thermal diffusion, forming substrate contacts, and continuing up to but not including the formation of the first level of metal (metal-1).

Back-end processes include forming interconnections ("wiring") between the active devices. The interconnections are formed using insulating layers and forming metal conductors in metal layers, with contacts connecting the first layer of metal to the substrate or polysilicon, and conductive vias forming vertical connections between layers of metal. Current advanced processes may include 10 or more metallization layers. The back-end processes continue through terminals, usually called bond pads, formed in a passivation layer that provide the external connectors to the wiring and thus to the integrated circuit. Packaging may be formed in the back-end process including passivation layers, and molding operations for example. Solder balls or bumps, bond wires, flip chip connections or the like may be used to connect the completed devices to a circuit board or substrate.

In various embodiments, the front-end and back-end processes are performed more or less simultaneously, or contemporaneously, and in parallel, saving cycle time. Further, the manufacture of the front-end substrate is performed without the need for performing multiple back-end processes on the front-end substrate, reducing PID defects or other damage defects on the active devices in the front-end substrate.

In an alternative embodiment, the front-end substrate and the back-end substrate each include a redistribution layer (RDL) which forms a bonding interface. The RDL includes metal pads in an insulating layer. Fusion bonding, hybrid bonding or thermocompressive bonding is used to form metal pad to metal pad bonds between the RDL on the front-end substrate and the corresponding RDL on the back-end substrate.

In various embodiments, manufacturing cycle time is reduced by applying wafer bonding to the problem of producing advanced CMOS integrated circuits. In producing the CMOS integrated circuits, the method embodiments include forming a device wafer or substrate including active transistors processed only in front-end processes (the "front-end substrate"), and a second substrate or wafer having metal layers forming connections corresponding to the active transistors formed in back-end processes, but not having any active devices requiring front end processing (the "back-end substrate"). The front-end and back-end substrates are processed separately. In an embodiment, the front-end and back-end substrates are processed in parallel, saving cycle time. The front-end and back-end substrates are then wafer bonded to form a device structure. In an embodiment, fusion bonding may be used. In another embodiment, a hybrid bonding may be used. In one embodiment the hybrid bonding such as is disclosed in the above referenced related patent application is used. In another embodiment method, a thermocompressive bonding of metal regions may be used. In another embodiment, the back-end substrate is removed by grinding, chemical-mechanical-processing (CMP) or etch processes, leaving the metal layers bonded to the front-end substrate.

In an embodiment, the back-end substrate, which is processed without the need for fabricating active devices, may be formed in a semiconductor process that differs from the semiconductor process used for the "front-end" substrate. The back-end substrate provides metal layers separated by interlevel dielectric layers, which in an embodiment are formed in a less advanced semiconductor process, for example a 40 nanometer wafer process, which provides a mature process, with lower manufacturing costs; while the front-end substrate can be manufactured in a very advanced semiconductor process, such as a 28 nanometer process or less. In this way the completed integrated circuit device advantageously provides the advanced transistor performance of the advanced semiconductor process, while the cycle time for the completed device is reduced by the parallel manufacture of the two substrates.

In various embodiments, the front-end substrate may include metal-oxide-semiconductor (MOS) FET transistors that form complementary MOS (CMOS) devices. In CMOS, n-type transistors and p-type transistors are formed on a single substrate using, for example, oppositely doped well regions separated by isolation regions. In one embodiment, CMOS inverters are formed with a common gate structure extending over an N-well and a P-well to form a PMOS and NMOS transistor coupled together as a CMOS inverter, the CMOS inverter is a commonly used circuit element. The active devices may include finFET and gate-all-around transistors, capacitors, memory cells, image sensors, and the like.

The back-end substrate may have two, three, four or many more levels of metal separated and isolated from one another electrically by intermetal dielectric layers or interlevel dielectric layers, as is known in the art. The metals may include copper (Cu), aluminum (Al), aluminum copper (AlCu), nickel (Ni), aluminum germanium (AlGe), and alloys of these metals. In one embodiment copper metal conductors are used. The dielectric layers may include oxides such as SiO2, nitrides such as SiN, silicon oxynitride (SiON), high-k dielectrics used in semiconductor devices, and low-k dielectric materials used in semiconductor devices. Vias, which are vertical openings are formed in the dielectric layers between metal layers are filled with conductive plugs or formed using via first or via last damascene processes and filled with conductor material in a plating operation.

The back-end substrate can include metal layers that in various embodiments are formed by dual and single damascene processes. In damascene, dielectric layers are patterned to form trenches. Conductive material is formed by electroplating or electroless plating to fill and overfill the trenches. CMP is used with or without etching to expose the top surface of the conductive material in the trenches, forming conductive lines. Additional layers are formed by depositing intermetal dielectric material and forming subsequent metal layers.

In an embodiment, fusion bonding is used. In fusion bonding, a dielectric or oxide layer is polished to be very smooth, with surface roughness less than 10 Angstroms and in another embodiment, less than 10 Angstroms and sometimes less than 5 Angstroms. When two substrates with a prepared surface of dielectric are placed in contact, bonding occurs. This fusion bonding can be performed with only slight pressure to initiate a bonding process by physically contacting the two surfaces, and at room temperature. An anneal can then be used to strengthen the bonds, which may be very weak bonds initially. However, conventional fusion bonding does not provide metal connections. Through via processes may then have to be performed to complete the electrical connections between the bonded wafers by forming vias and filling them with conductor material, this is done after the fusion bonding processes are completed.

In an embodiment, a thermocompression wafer bonding can be used to bond metal pads on wafers to form bonded wafers. In thermocompression, metal pads are bonded using mechanical pressure and high temperatures to cause metal bonding. The metal pads may be elevated above a dielectric layer by recessing the dielectric layer in an etch process prior to bonding, to improve the bonding process. Thermocompression bonding can successfully bond metal regions, however, the high temperatures and high pressures required can cause additional defects and reduce yields in the finished devices. Certain materials may not be compatible with the high temperatures of conventional thermocompression bonding, such as advanced dielectric materials.

In another embodiment, hybrid bonding is used to bond the wafers. In hybrid bonding, dielectric material is bonded in a manner similar to fusion bonding, and metal pads are bonded using an anneal process. In the related application incorporated by reference above, method embodiments are disclosed for a hybrid bonding process where the metal pads are oxidized to form a metal oxide, the metal oxides are etched from the metal pads, forming metal pads with well controlled surface profiles, and the wafers are first bonded with a contact bond, and then subjected to a relatively low temperature anneal to form metal pad to metal pad bonds. Both dielectric surfaces and metal pads bond in the hybrid bonding process.

FIG. 1 depicts in cross sectional view a portion of a semiconductor device 100 that may be formed using the method embodiments. In FIG. 1, a multiple level metal structure is formed over a substrate to provide a CMOS integrated circuit. Layer 111 includes an active area on a semiconductor substrate, including transistors with source, drain, and gate regions, and vias connecting the transistors to a metal 1 wiring layer. Layer 113 provides a metal 2 wiring layer. Layer 115 provides a metal 3 wiring layer. Layer 109 provides a top metal layer, which provides a top metal structure 107 for connection. Layer 109 further includes a layer 103 for a pad 105. A passivation layer 101 is formed over the device and opened to expose pad 105 for external connections, for example by bond wires, solder balls, solder bumps, and the like.

The device 100 can be manufactured using a conventional CMOS process, and as described above, if that is the case, a long cycle time will be needed to complete the device with the front-end process performed first on the substrate to form layer 111, and the back-end processes then formed in sequence to form the remaining layers.

The embodiments provide methods using wafer bonding to manufacture the device 100 using reduced cycle time. This is accomplished by manufacturing a front-end substrate and simultaneously or contemporaneously, manufacturing a back-end substrate. The manufacture of the back-end substrate does not follow the completion of the front-end processing and so it may be done in parallel, or even before, the front-end processing on the front-end substrate. In this manner the steps that were performed sequentially in the conventional approach may now be done in parallel and independently, increasing flexibility in manufacture and reducing cycle time.

Figure 2:
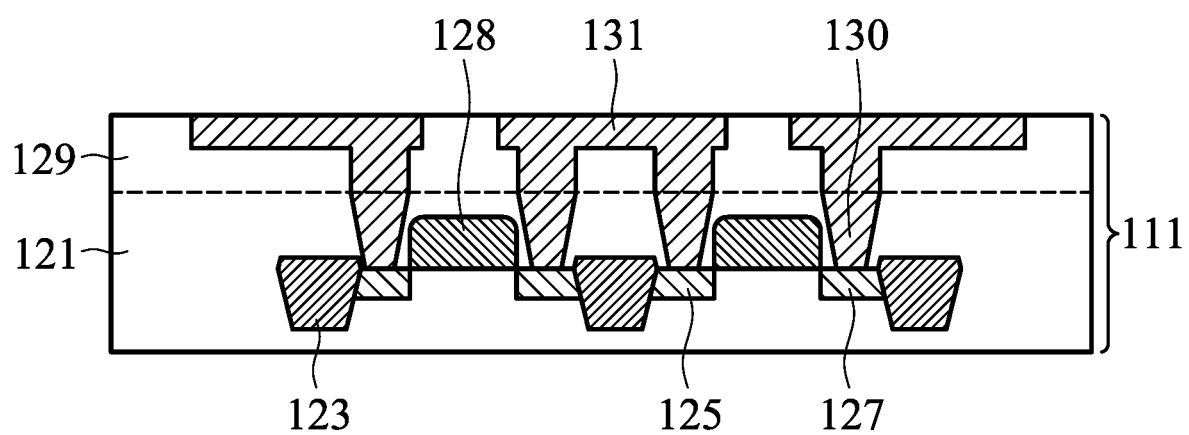
FIG. 2 illustrates in a cross-sectional view a front-end substrate of the embodiments.

FIG. 2 depicts in cross section an example front-end substrate 111 for use with the embodiments. In FIG. 2, a substrate 121 includes an active area which includes isolation regions 123, which may be shallow trench isolation regions, source regions 125, drain regions 127, which are doped regions in the semiconductor substrate, gate regions 128 which include polysilicon or metal gate conductors formed over a gate dielectric region, vias 130 that form vertical conductive connections between the substrate and metal 1, which is a conductive layer 131. In sharp contrast to the prior approaches, in the embodiments, the front-end substrate 111 is only processed up to the metal 1 layer as shown. Because the layers of intermetal dielectric and the many metal layers above metal 1 are not formed on the substrate 121, damage such as PID defects is less likely, and yield is increased. In the embodiments, the cycle time to produce the front-end substrate is much shorter than the time to produce a conventional semiconductor wafer as the back-end processes are not performed on the front-end substrate.

Figure 3:
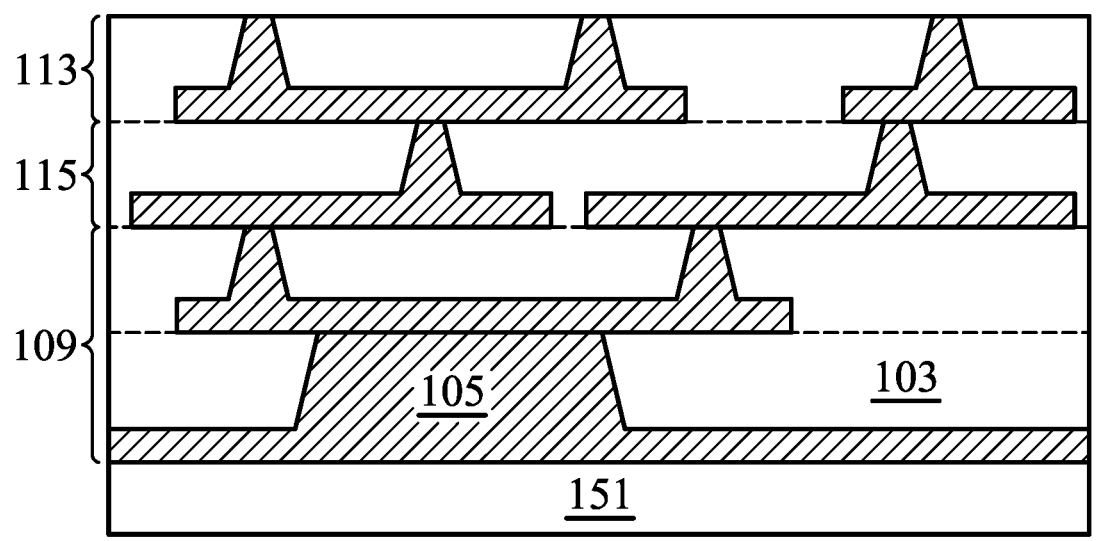
FIG. 3 illustrates in a cross-sectional view a back-end substrate of the embodiments.

FIG. 3 depicts in a cross-sectional view, a back-end substrate 150 corresponding to the front-end substrate 111 of FIG. 2. In FIG. 3, a carrier substrate 151, which may be a silicon substrate, or other material compatible with back-end processes such as a glass or ceramic substrate, is shown with metal layers formed in interlevel dielectric layers above it. Note that in this non-limiting example embodiment, the back-end substrate is processed top-to-bottom, that is, the top metal layer 109 is formed on the carrier substrate 151, and the metal three layer 115 is then formed, and finally the metal 2 layer 113 is formed. This arrangement is done in this embodiment so that the back-end substrate may be turned over, and aligned face down to the front-end substrate, and as described below, bonded so that metal-2 layer, 113, is bonded to the metal-1 layer on the front-end substrate 111 shown in FIG. 2.

Figure 4:
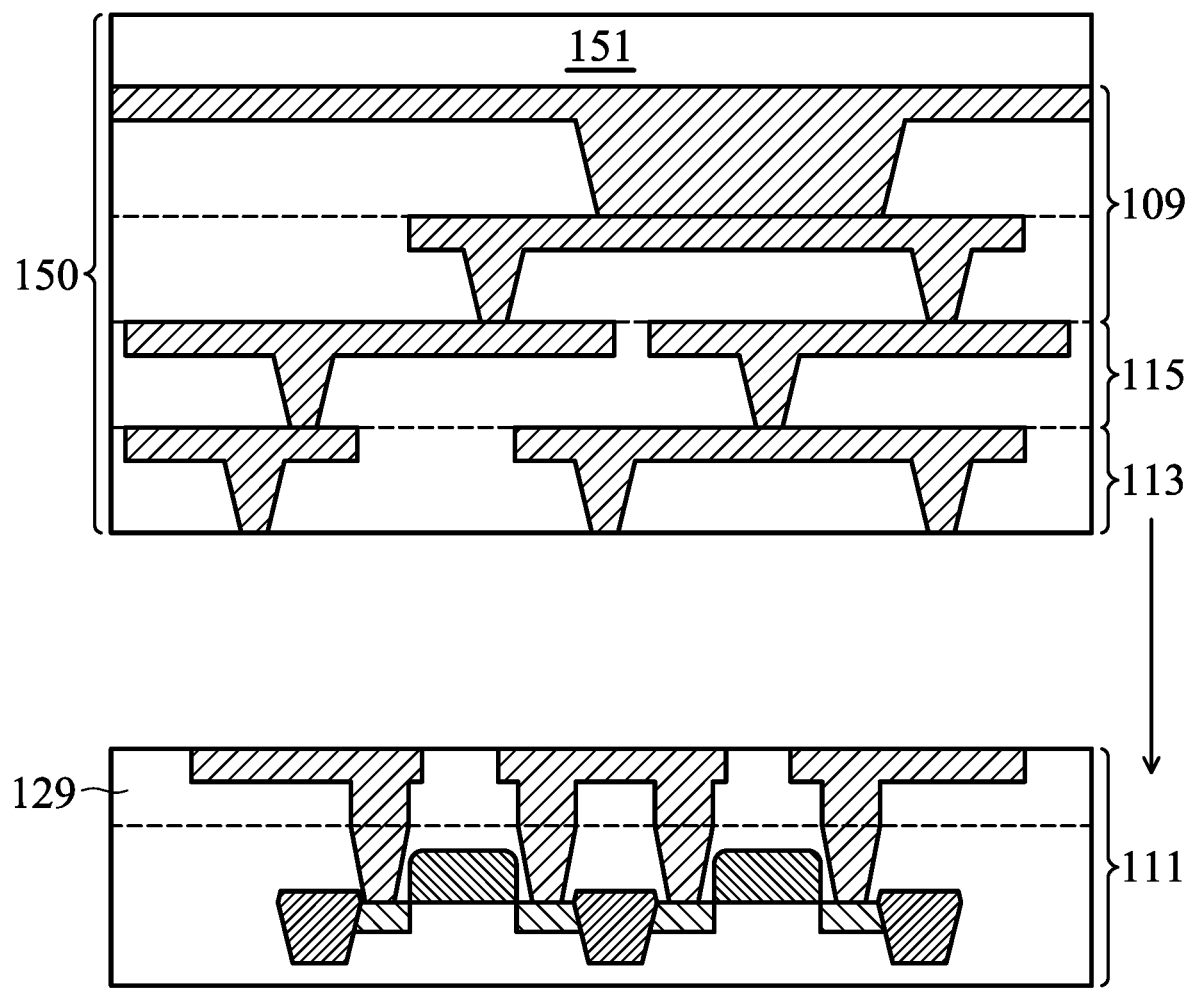
FIG. 4 illustrates in a cross-sectional view the front-end and back-end substrates of the embodiments in a wafer bonding process.

FIG. 4 illustrates, in a cross-sectional view, a wafer bonding operation. The back-end substrate 150 illustrated in FIG. 3 is now arranged face down and aligned with the face of front-end substrate 111. After alignment, the wafers are brought into physical contact. In an embodiment, the dielectric surfaces have been prepared to a smoothness so that the dielectrics of the front-end substrate and the back-end substrate can form fusion bonds. An anneal process is then performed to form metal pad to metal bonds between the substrates. In various embodiments, the hybrid bonding includes the methods of the related application incorporated by reference above, in which prior to bonding, both the substrates are subjected to an oxidation step to form metal oxides on the metal pads at the bonding surface for each substrate, the metal oxides are subjected to a wet etch to form uniform surfaces on the metal portions, and the substrates are then placed into contact, and a thermal anneal of between 100 and 400 degrees C. is performed to form metal pad to metal bonds, as well as dielectric or oxide-oxide bonds, in the hybrid bonding process. In an embodiment, the metal layers are copper, and the dielectric layers are silicon oxide. The metal oxidation process forms copper oxide, which is etched in a wet etch process. The method embodiments of this application are not limited to a specific wafer bonding process, however.

Figure 5:
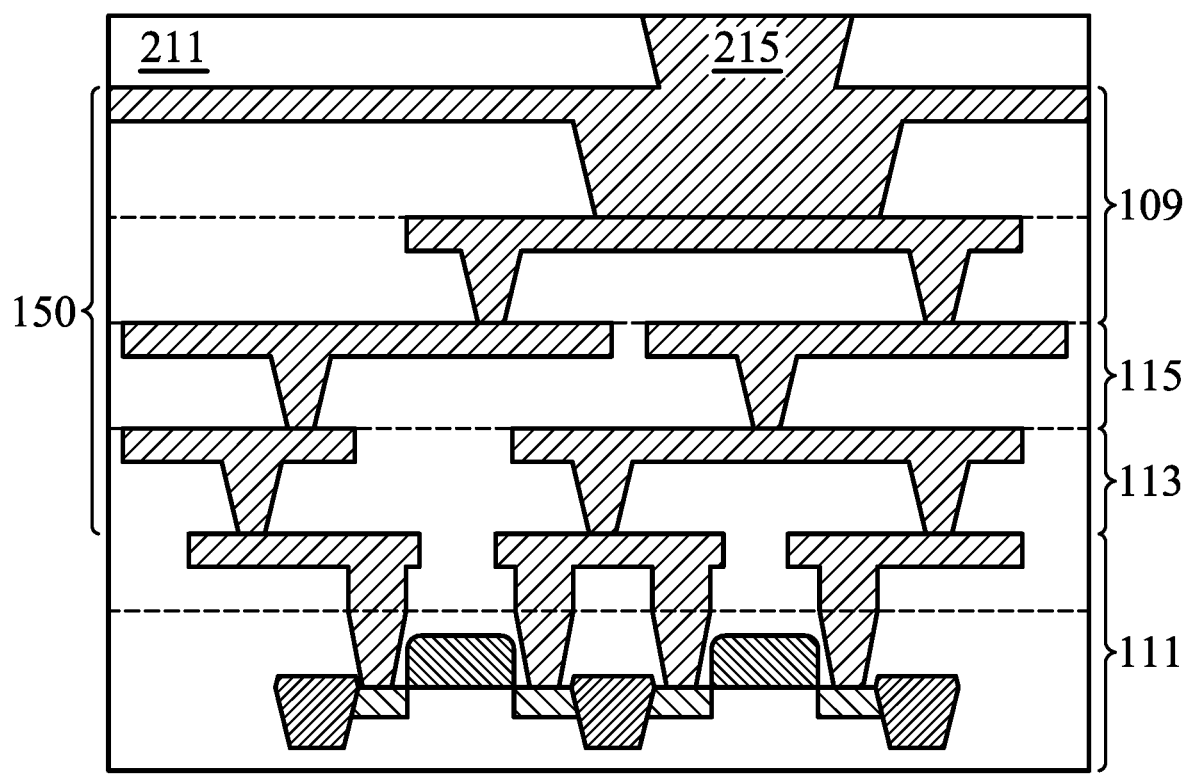
FIG. 5 illustrates in another cross-sectional view an integrated circuit structure formed by the bonding process of FIG. 4.

FIG. 5 illustrates in a cross-sectional view the structure 200 after the wafer bonding. In FIG. 5, the carrier substrate has been removed such as by backgrinding and a passivation layer 211 is shown with a pad 215 for an external connection. Comparing FIG. 1 to FIG. 5, it can be seen that the method embodiments have produced an equivalent structure to the integrated circuit structure of conventional CMOS production used in a conventional process flow, however the use of the embodiments provides greatly reduced cycle time.

It is noted that for fusion bonding between dielectric layers, the surfaces are subject to a smoothness requirement. A low roughness is necessary. While a typical CMOS semiconductor process may result in a surface roughness having a root mean square roughness of around 10 Angstroms, for a fusion bonding interface, the surfaces need a roughness of less than 10 Angstroms. In an embodiment, the surfaces of the dielectric layers at the bonding interface have a roughness around 5 Angstroms. Further, for fusion bonding the surfaces should be more hydrophilic than a standard CMOS process provides. For example, in an embodiment the surface should have a contact angle of less than 15 degrees for the fusion bonding.

Figure 6:
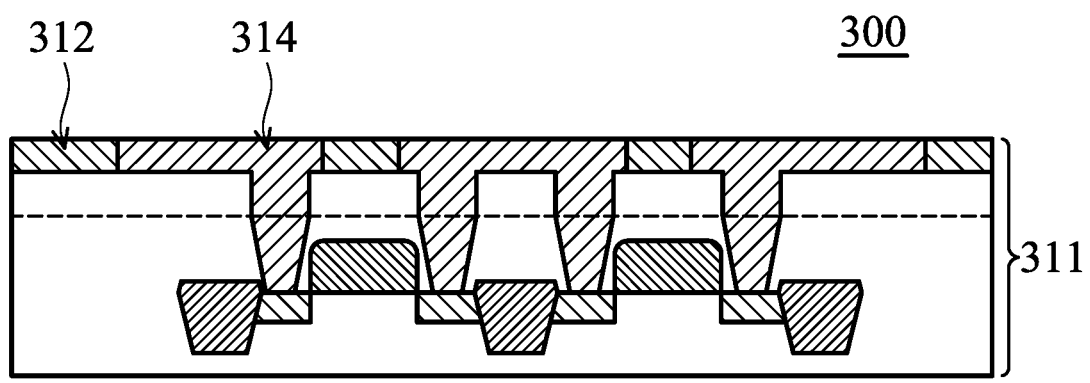
FIG. 6 illustrates in another cross-sectional view a front-end substrate of an alternative embodiment.

FIG. 6 illustrates, in a cross-sectional view, an alternative front-end substrate 300 with a first layer 311, however in addition to the semiconductor substrate having active areas, transistors, and vias, a redistribution layer is formed using insulator or dielectric layer 312 and a metal pattern 314. The dielectric 312 may be a dielectric material such as silicon nitride, in one embodiment. Other materials may be used that are compatible with fusion bonding. The metal redistribution layer may perform a "mapping" function and change the connection pattern of the devices in the underlying layer. Further the metal pads 314 may be of larger area than in the prior embodiments, providing additional bonding structure. In an embodiment, copper metal pads are formed.

Figure 7:
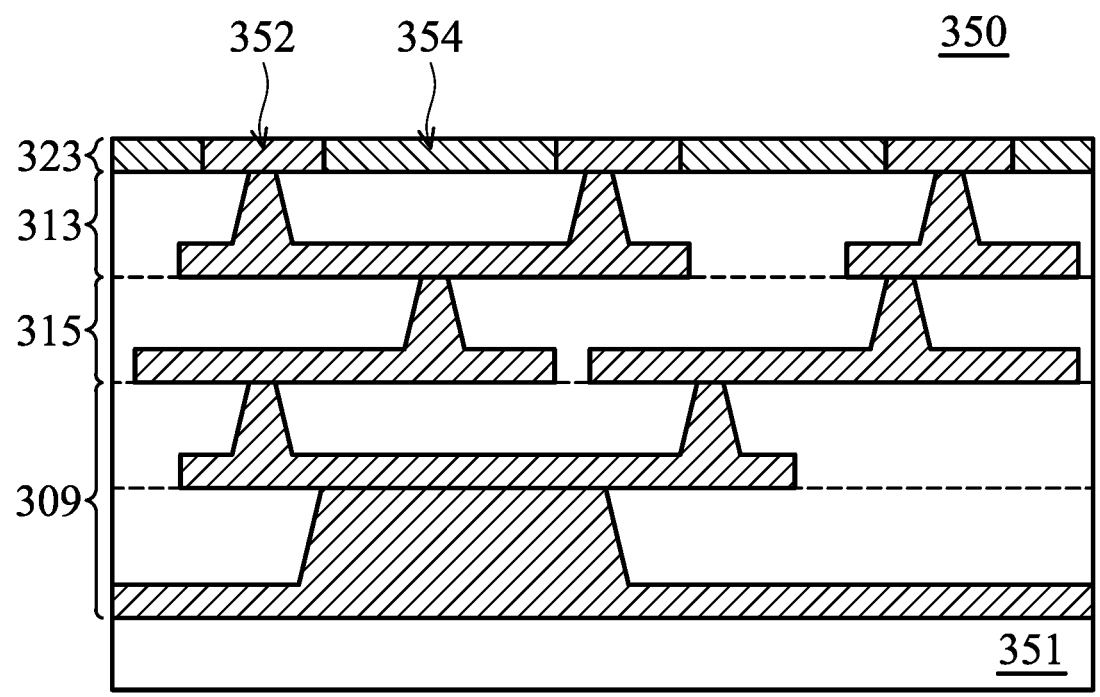
FIG. 7 illustrates in a cross-sectional view a back-end substrate of the alternative embodiment of FIG. 6.

FIG. 7 illustrates, in a cross sectional view, a back-end substrate 350 for use in a method embodiment with the front-end substrate 300. Back-end substrate 350 includes a carrier substrate 351, which may be a semiconductor substrate such as a silicon wafer, or another material such as glass or ceramic that is compatible with back-end processes in a semiconductor manufacturing facility. As for the back-end substrate of FIG. 3, above, in an embodiment the back end processing is performed from top to bottom, so that the layer 309 is formed on the carrier substrate 351, and this is the top metal layer. The layer 315 is next, the metal-3 layer, the metal-2 layer 313 is formed next. In this embodiment, a redistribution layer (RDL) 354 is formed over the metal-2 layer, and, metal pads 352 are formed in contact with the vias of the metal-2 layer. The redistribution layer may perform a mapping function, moving connections from the underlying structure to new locations, for example to change the connections for different versions of a device. The metal pads 352 are larger than the vias in the metal-2 layer and thus use of the RDL layers provide increased area for metal bonding.

Figure 8:
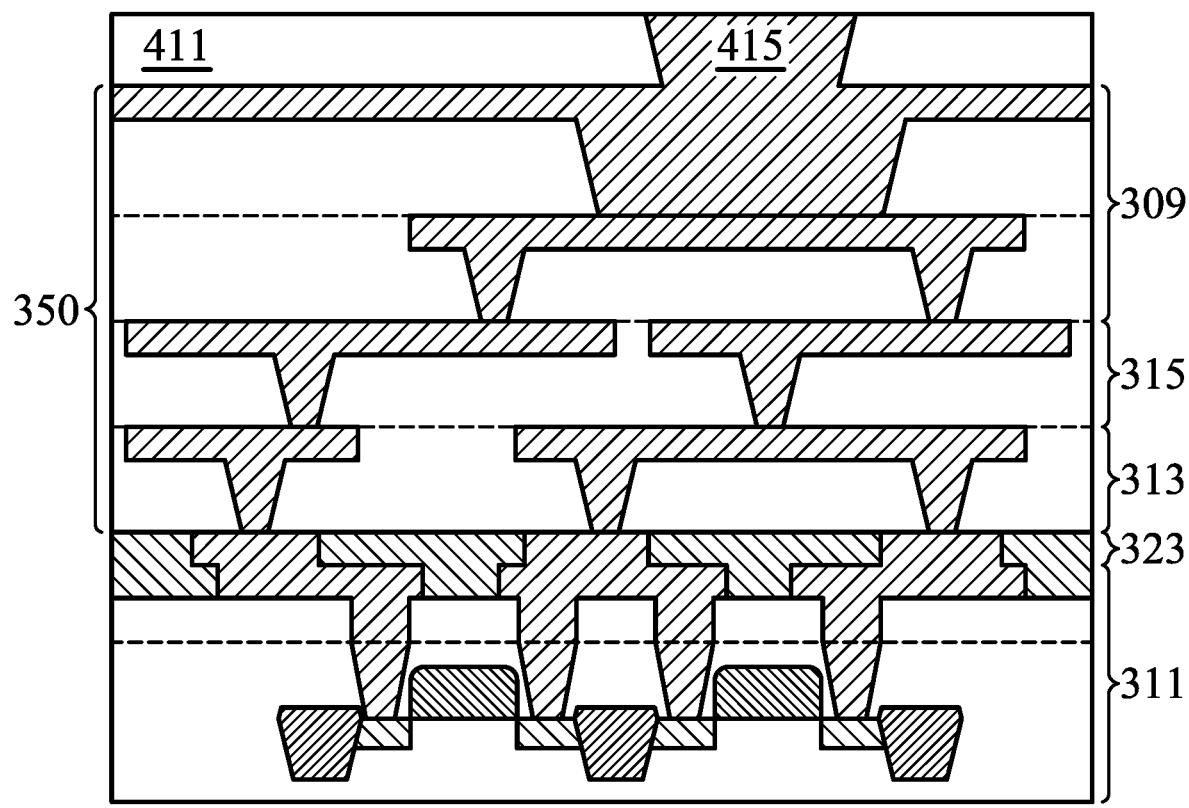
FIG. 8 illustrates in a cross-sectional view an embodiment integrated circuit structure formed buy bonding the front-end substrate of FIG. 6 and the back-end substrate of FIG. 7.

FIG. 8 illustrates, in another cross-sectional view, a completed structure 400 that includes the redistribution layers in the front-end substrate and the back-end substrates as shown in FIGS. 7 and 8, after wafer bonding is performed. As described above with respect to FIG. 5, the structure 400 includes a passivation layer 411 and a pad 415 for external connections, the carrier substrate has been removed, for example by backgrinding or CMP processes. The redistribution layer and metal pads of this embodiment provide larger metal areas, increasing the bonding area for the wafer bonding. In an embodiment, hybrid bonding is used to bond the front-end and back-end substrates. In another embodiment, the hybrid bonding includes performing CMP on the redistribution layers to polish the insulator and to expose the metal pads, aligning the front-end substrate and the back-end substrate in a face to face relation, and contacting the faces to one another. Fusion bonding may occur on contact. A thermal anneal is performed to cause the metal pads to form metal bonds. In another embodiment, hybrid bonding is performed using the methods disclosed in the related application, wherein the substrates are subjected to an oxidation to form metal oxides, the metal oxides are etched from the metal pads, leaving uniform surfaces on the metal pads, the front-end and back-end substrates are aligned and brought into contact, where fusion bonding may occur between the insulators of the redistribution layers, and the structure is annealed to cause the metal pads to form bonds.

In an alternative embodiment, the front-end substrate with the redistribution layer may be bonded to the back-end substrate with the redistribution layer using a thermocompression bonding. The various embodiments are not limited to a specific wafer bonding method.

In various embodiments, the metal for the metal pads is chosen from copper (Cu), aluminum (Al), aluminum copper (AlCu), nickel (Ni), aluminum germanium (AlGe), and alloys of these metals. The metals are formed as damascene structures in a dielectric material. The dielectric materials in various embodiments is chosen from oxides such as $SiO_2$, nitrides such as SiN, silicon oxynitride (SiON), high-k dielectrics used in semiconductor devices, carbon containing dielectrics such as SiOC, and low-k dielectric materials used in semiconductor devices.

In one embodiment, copper metal pads are formed surrounded by dielectric material using a damascene or dual damascene metallization scheme on both the front-end and the back-end substrates. After chemical-mechanical polishing (CMP) and planarization, the substrates are subjected to an oxidation process. In this example embodiment, copper oxide is formed using $O_2$ plasma. In alternative embodiments, other oxidation processes are used. A steam oxidation process such as in situ steam generation (ISSG) can be used.

In one embodiment, copper oxide removal is then performed by wet etch processing. In one embodiment, a dilute HF etch is used. In alternative embodiments, the wet etch is chosen from etches including DHF at 2% concentration, HCl, HCOOH, and citric acid. In some embodiments, the temperatures in the etch process are less than 250 degrees C.

Following the removal of the copper oxide, the substrates are inspected for copper pad profile match. The pads may be recessed slightly from the surface of the dielectric material. The formation of the copper oxide followed by a well-controlled etch process reduces or eliminates the non-uniform surfaces that result from the CMP processes, such as dishing. Control of the process allows for creation of slightly convex or concave surfaces on the surfaces of the metal pads.

By use of the embodiment methods, the copper pads have more or less uniform surfaces. The front-end and back-end substrates with the well matched copper pad profiles are brought into alignment and placed in contact, with the dielectric layers in physical contact and the copper pads of the top and bottom substrates being spaced slightly apart. Slight pressure is applied to ensure the dielectric surfaces of the substrates are in good contact. Fusion bonding of the dielectric layers may begin. Once the substrates are initially bonded, a relatively low temperature anneal is performed. During the anneal, the copper pads form bonds. The bonding between the dielectric layers will continue or bond strength will increase during the anneal. When the copper pads are well matched and the metal pad recess depths are within certain predetermined ranges, robust copper bonds are formed and the substrates are bonded together; this is referred to as a "seamless" bond where the copper material appears to be uniform across the bond interface.

Figure 9:
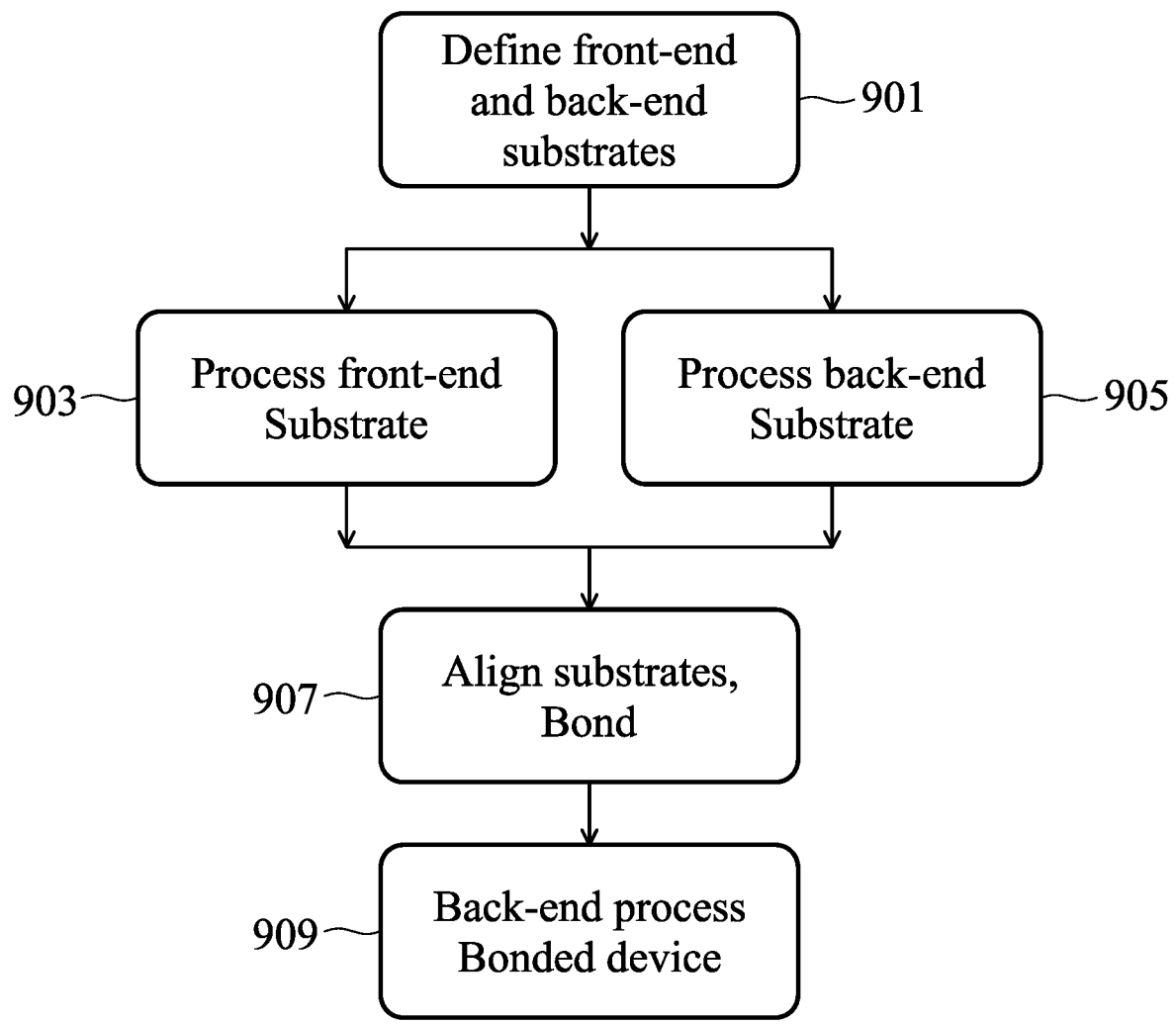
FIG. 9 illustrates in a simplified flow diagram the steps of a method embodiment.

FIG. 9 depicts in a flow diagram, an example method embodiment. In FIG. 9, an integrated circuit to be manufactured is described at step 901 as a front-end substrate having one or more active devices formed therein, and a back-end substrate having connections formed as metal layers separated by insulator layers, the metal layers corresponding to connections to be formed to the front-end substrate. In various embodiments, as described above, the front-end and back-end substrates may include redistribution layers.

At step 903, the front-end substrate is processed. In an example embodiment, the front-end substrate can be processed at an advanced semiconductor process node. Semiconductor process nodes are typically characterized by the minimum feature size, or critical dimension, the process can produce. Often the minimum feature size is a minimum gate width for a transistor. An advanced semiconductor process node at present may be a "28 nanometer" process node, with smaller nodes such as 20 nanometers, 16 nanometers, and so on in production or coming into production.

The front-end substrate as described above will include one or more (often millions) of active devices such as transistors. In an embodiment the transistor are CMOS transistors. Other types of transistors or devices may be formed, including finFET transistors for example, or gate all around devices.

At step 905, and in parallel with and independently from step 903, the back-end substrate is processed. As described above, the back-end substrate is free from active devices and may be a ceramic, glass or other material that is compatible with back-end processing. The back-end substrate may also be a silicon substrate or silicon wafer. The back-end substrate, at step 905, may in one embodiment be processed in the same semiconductor process node as the front-end substrate. In various embodiments, the back-end substrate is processed at a different technology node. In some embodiments, the back-end substrate can be processed at a less advanced technology node, which may save costs. For example, in an example embodiment the front-end substrate may be processed at a node of 28 nanometers, or less; while the back-end substrate is processed at a node of greater than 28 nanometers.

Also, the steps 903 and 905 can be done simultaneously, contemporaneously or in any order, adding schedule flexibility to the manufacturing process. When these steps are performed in parallel, cycle time is reduced over the conventional CMOS processing.

At step 907, the front-end substrate and the back-end substrate are brought into face to face alignment and wafer bonding is performed. In various embodiments, hybrid bonding is performed. As described above hybrid bonding forms bonds between the respective dielectric layers and the metal pads of both the front-end and back-end substrates. However, fusion bonding, or thermocompression bonding, can be performed in other embodiments to bond the substrates.

At step 909, the bonded devices are processed further in back-end processes such as solder bumping, wire bonding, packaging, to complete the device.

The front-end substrate and back-end substrates may be independently modified, adding design flexibility and the possibility of design reuse. For example, in an embodiment using the redistribution layers, the RDL layers may map connections to the active devices differently, forming additional variations of a design, without the need for redesigning the front-end substrate.

Use of the embodiments advantageously provides methods to produce highly integrated devices with reduced cycle time, by using wafer bonding to form robust dielectric bonds and metal bonds between a front-end substrate with active devices, and a back-end substrate that is free from active devices. Advanced semiconductor processes may be used for the front-end substrate, providing excellent transistor performance, while the back-end substrate may be formed in a less advanced, and less expensive, semiconductor process.

In an embodiment, a method includes defining an integrated circuit function using a front-end substrate having one or more active devices and a back-end substrate having connections formed in metal layers in dielectric material, wherein the back-end substrate is free from active devices; manufacturing the front-end substrate in a first semiconductor process; more or less simultaneously, manufacturing the back-end substrate in a second semiconductor process; physically contacting bonding surfaces of the front-end substrate and the back-end substrate; and performing wafer bonding to form bonds between the front-end and back-end substrates to form a structure including the integrated circuit.

In an example embodiment, a method is provided that includes defining an integrated circuit function using a front-end substrate having one or more active devices and a back-end substrate having connections formed in metal layers in dielectric material, wherein the back-end substrate is free from active devices; manufacturing the front-end substrate in a first semiconductor process; more or less simultaneously, manufacturing the back-end substrate in a second semiconductor process; physically contacting bonding surfaces of the front-end substrate and the back-end substrate; and performing wafer bonding to form bonds between the front-end and back-end substrates to form an integrated circuit. In an additional embodiment in the above method, the front-end substrate comprises transistors. In a further embodiment, manufacturing the back-end substrate comprises providing a carrier substrate; depositing a top layer metal layer over the carrier substrate; patterning the top layer metal layer to form pads for external connection; forming a passivation layer over the top metal layer; forming an interlevel dielectric layer over the passivation layer; patterning the interlevel dielectric layer to form via openings; forming a metal interconnect layer over the interlevel dielectric layer and filling the via openings with metal; and continuing to form additional metal interconnect layers and interlevel dielectric layers to form a metal interconnect structure.

In yet another embodiment, in the above method, performing the wafer bonding process further comprises growing an oxide layer over a top surface of the front end substrate and growing an oxide layer over the top surface of the back end substrate; performing an oxide etch to remove the oxide layers and provide a smooth surface on each of the front end and back end substrates; and bringing the smooth surfaces of both the front end and back end substrates into contact for bonding.

In still a further embodiment, the method includes after the bonding, performing a thermal anneal to strengthen the wafer bond. In yet another embodiment, in the above methods the thermal anneal is performed at a temperature of between 100 and 400 degrees C. In still another embodiment, in the above methods, the first semiconductor process has a first minimum feature size, and the second semiconductor process has a second minimum feature size, and the second minimum feature size is greater than the first minimum feature size. In still a further embodiment, in the above methods, the first and second semiconductor process have the same minimum feature size. In yet another embodiment, in the above methods, the first semiconductor process has a minimum feature size that is equal to, or less than 28 nanometers. In an alternative embodiment, in the above methods, the second semiconductor process has a minimum feature size that is greater than 28 nanometers. In still a further embodiment, in the above methods, the methods further comprise removing the carrier substrate from the back end substrate.

In another alternative embodiment, a method includes manufacturing a front-end substrate having a plurality of active devices in the front-end substrate in a first semiconductor process; more or less simultaneously, manufacturing a back-end substrate in a second semiconductor process having connections formed in metal layers in dielectric material, wherein the back-end substrate is free from active devices; forming a redistribution layer over the front end substrate and the back end substrate, the redistribution layer including metal pads and dielectric material separating the metal pads; physically contacting the surfaces of the redistribution layers of the front-end substrate and the back-end substrate; and performing wafer bonding to form bonds between the front-end and back-end substrates to form an integrated circuit. In still a further embodiment, the method further includes performing CMP on the redistribution layer of the front-end substrate and the back-end substrate to smooth the surfaces prior to physically contacting the surfaces. In yet another embodiment, the method further includes performing a thermal anneal after bonding the front end substrate to the back end substrate. In still a further embodiment, the method includes the metal pads that are one selected from the group consisting essentially of copper (Cu), aluminum (Al), aluminum copper (AlCu), nickel (Ni), aluminum germanium (AlGe), and alloys of these metals. In still another embodiment of the above methods, the dielectric material of the redistribution layer is one selected from the group consisting essentially of $SiO_2$, SiN, SiON, high-k dielectric, carbon containing dielectric, and low-k dielectric material.

In a further embodiment, a method includes forming in a first semiconductor process a front-end substrate comprising at least a portion of a semiconductor wafer and active devices formed within the front-end substrate, and at least one metallization layer, and having a first redistribution layer on an upper surface comprising metal pads and dielectric material between the metal pads; forming, in a second semiconductor process different from the first semiconductor process, a back-end substrate comprising a carrier substrate, at least one metallization layer, and having a second first redistribution layer on an upper surface comprising metal pads and dielectric material between the metal pads; smoothing the surfaces of the first and second redistribution layers; bringing the first and second redistribution layers into contact so that the metal pads of the front-end substrate and the back-end substrate are in physical contact; and bonding the first and second redistribution layers together. In yet a further embodiment, the bonding comprises thermocompressive bonding. In still another embodiment, the above methods include smoothing which further comprises performing CMP on both the first and second redistribution layers to planarize the layers. In yet another embodiment, in the above methods, the smoothing further comprises forming an oxide layer on the first and second redistribution layers; and performing an oxide etch on the oxide layer and exposing the metal pads of the first and second redistribution layers.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A method, comprising:
    manufacturing a first front-end substrate having a plurality of active devices in the first front-end substrate in a first semiconductor process;
    manufacturing a first back-end substrate in a second semiconductor process, the first back-end substrate comprising metallization layers disposed in dielectric material, wherein the first back-end substrate is free from active devices;
    forming a first redistribution layer over the first front-end substrate and the first back-end substrate, the first redistribution layer including first metal pads and first dielectric material separating the first metal pads;
    oxidizing a first surface of the first redistribution layer over the first front-end substrate and a second surface of the first redistribution layer over the first back-end substrate;
    etching the oxidized first surface and the oxidized second surface of the first redistribution layer, wherein after the etching the oxidized first surface and the oxidized second surface of the first redistribution layer, the first metal pads have convex surfaces, and the convex surfaces of the first metal pads are recessed from a surface of the first dielectric material;
    after the etching the oxidized first surface and the oxidized second surface of the first redistribution layer, physically contacting the first surface of the first redistribution layer and the second surface of the first redistribution layer; and
    performing wafer bonding to form bonds between the first front-end substrate and the first back-end substrate to form a first integrated circuit.

2. The method of claim 1, wherein the oxidizing the first surface of the first redistribution layer and the second surface of the first redistribution layer is performed at least in part with an oxygen plasma.

3. The method of claim 1, wherein the oxidizing the first surface of the first redistribution layer and the second surface of the first redistribution layer is performed at least in part with an in situ steam generation process.

4. The method of claim 1, wherein the etching the oxidized first surface and the oxidized second surface of the first redistribution layer is performed at least in part with a wet etch process.

5. The method of claim 4, wherein the wet etch process is performed at a temperature of less than 250° C.

6. The method of claim 1, wherein the first back-end substrate comprises:
    a carrier substrate;
    a bonding pad over the carrier substrate, the bonding pad being disposed between the carrier substrate and the metallization layers;
    a first dielectric layer at a first side of the first back-end substrate, the first dielectric layer surrounding the bonding pad; and
    a second dielectric layer at a second side of the first back-end substrate, the second dielectric layer surrounding a subset of the metallization layers.

7. The method of claim 1, wherein the first front-end substrate is manufactured at a first technology node, and the first back-end substrate is manufactured at a second technology node.

8. The method of claim 1, wherein the second surface of the first redistribution layer has a roughness of less than 10 Å.

9. A method, comprising:
    forming, in a first semiconductor process, a first front-end substrate comprising at least a portion of a first semiconductor wafer and active devices formed within the first front-end substrate, and at least one first metallization layer, and having a first redistribution layer comprising first metal pads and first dielectric material between the first metal pads;

forming, in a second semiconductor process different from the first semiconductor process, a first back-end substrate comprising at least one second metallization layer and a second redistribution layer over the at least one second metallization layer, the second redistribution layer comprising second metal pads and second dielectric material between the second metal pads;

oxidizing upper surfaces of the first metal pads and the second metal pads;

after the oxidizing, smoothing the upper surfaces of the first metal pads and the second metal pads, wherein after the smoothing the upper surfaces, the upper surfaces of the first metal pads are first convex bonding surfaces and are recessed below an upper surface of the first dielectric material, and the upper surfaces of the second metal pads are second convex bonding surfaces and are recessed below an upper surface of the second dielectric material;

after smoothing the upper surfaces of the first metal pads and the second metal pads, bringing the first and second redistribution layers into contact so that the first convex bonding surfaces of the first metal pads and the second convex bonding surfaces of the second metal pads are in physical contact; and bonding the first and second redistribution layers together.

10. The method of claim 9, wherein after the smoothing the upper surfaces of the first and second redistribution layers, at least one of the first and second redistribution layers has a roughness of less than 10 Å.

11. The method of claim 9, wherein after the smoothing the upper surfaces of the first and second redistribution layers, at least one of the first and second redistribution layers has a contact angle of less than 15 degrees.

12. The method of claim 9, wherein bonding the first and second redistribution layers together is performed at least in part with an annealing process.

13. The method of claim 9, wherein the forming the first front-end substrate is performed in parallel with the forming the first back-end substrate.

14. The method of claim 9, wherein the first semiconductor process is performed at a first technology node, and the second semiconductor process is performed at a second technology node.

15. A method, comprising:

receiving a first front-end substrate, the first front-end substrate having first metal bonding surfaces and first dielectric bonding surfaces, the first front-end substrate comprising first active devices in a first pattern;

receiving a first back-end substrate, the first back-end substrate comprising first metallization layers in a second pattern, the first metallization layers being disposed in first dielectric material, the first back-end substrate having second metal bonding surfaces and second dielectric bonding surfaces;

converting a first portion of the first metal bonding surfaces of the first front-end substrate to a first oxide;

converting a second portion of the second metal bonding surfaces of the first back-end substrate to a second oxide;

performing a wet etch process on the first metal bonding surfaces of the first front-end substrate and the second metal bonding surfaces of the first back-end substrate, wherein the wet etch process removes the first oxide and the second oxide, and creates first convex surfaces on the first metal bonding surfaces of the first front-end substrate and second convex surfaces on the second metal bonding surfaces of the first back-end substrate, the first convex surfaces being recessed from the first dielectric bonding surfaces, the second convex surfaces being recessed from the second dielectric bonding surfaces;

after performing the wet etch process and creating the first and second convex surfaces, physically contacting the first convex surfaces of the first front-end substrate and the second convex surfaces of the first back-end substrate; and performing wafer bonding to form bonds between the first front-end substrate and the first back-end substrate, wherein the performing wafer bonding bonds the first metal bonding surfaces to the second metal bonding surfaces and also bonds the first dielectric bonding surfaces to the second dielectric bonding surfaces.

16. The method of claim 15, wherein the converting the first portion of the first metal bonding surfaces of the first front-end substrate to the first oxide is performed at least in part with an oxygen plasma.

17. The method of claim 15, wherein the converting the first portion of the first metal bonding surfaces of the first front-end substrate to the first oxide is performed at least in part with an in situ steam generation process.

18. The method of claim 15, wherein the performing the wet etch process utilizes dilute HF.

19. The method of claim 18, wherein the performing the wet etch process is performed at a temperature of less than 250° C.

20. The method of claim 15, further comprising, before the physically contacting the first convex surfaces of the first front-end substrate and the second convex surfaces of the first back-end substrate, inspecting the first convex surfaces and the second convex surfaces for pad profile match.

* * * * *